United States Patent [19]

Colwell et al.

[11] Patent Number: 5,773,855
[45] Date of Patent: Jun. 30, 1998

[54] MICROELECTRONIC CIRCUIT INCLUDING SILICIDED FIELD-EFFECT TRANSISTOR ELEMENTS THAT BIFUNCTION AS INTERCONNECTS

[75] Inventors: Michael Colwell, Livermore; Gary Cheung, Fremont, both of Calif.; Paul Torgerson, Inver Grove Heights, Minn.

[73] Assignee: LSI Logic Corporation, Milpitas, Calif.

[21] Appl. No.: 792,479

[22] Filed: Jan. 31, 1997

Related U.S. Application Data

[63] Continuation of Ser. No. 342,534, Nov. 21, 1994, abandoned.

[51] Int. Cl.⁶ .................................................. H01L 29/72
[52] U.S. Cl. ............................ 257/206; 257/207; 257/208; 257/754; 257/773; 257/786; 438/180; 438/197; 438/106; 438/213; 438/279; 438/655; 438/694
[58] Field of Search ..................................... 257/754, 206, 257/773, 786, 207, 208; 438/106, 213, 197, 180, 279, 655, 694

[56] References Cited

U.S. PATENT DOCUMENTS 4,890,191 12/1989 Rokos ...................................... 257/754
4,946,798 8/1990 Kawakatsu ............................... 257/754
5,438,214 8/1995 Egawa et al. ............................ 257/754

*Primary Examiner*—Edward Wojciechowicz
*Attorney, Agent, or Firm*—Oppenheimer, Wolff & Donnelly LLP

[57] ABSTRACT

Field-effect transistors are formed on a substrate having silicided elements including diffusion (source and drain) regions and polysilicon gates. The silicided surfaces of these elements have low ohmic resistance and are used to provide interconnection between contacts that are spaced from each other, thereby freeing routing areas for other interconnections. The diffusion regions of adjacent transistors have edges that face each other, and are formed with indentations which constitute portions of a substrate tap area. The low ohmic resistance of the silicided surfaces of the diffusion regions enables the substrate tap area to be cut out of the diffusion regions without degrading the electrical performance of the transistors, thereby providing a substantial reduction in the space required for the transistors on the substrate.

12 Claims, 2 Drawing Sheets

5,773,855

MICROELECTRONIC CIRCUIT INCLUDING SILICIDED FIELD-EFFECT TRANSISTOR ELEMENTS THAT BIFUNCTION AS INTERCONNECTS

This application is a continuation of application Ser. No. 08/342,534 filed on Nov. 21, 1994, now abandoned.

BACKGROUND OF THE INVENTION

1. Field of the Invention

The present invention generally relates to the art of microelectronic integrated circuits, and more specifically to a microelectronic circuit including silicided field-effect transistor elements that bifunction as interconnects.

2. Description of the Related Art

The continuous progress in fabrication technology for microelectronic integrated circuits enables feature sizes to be reduced and the number of devices that can be fabricated on a single wafer to be progressively increased. Devices including field-effect transistors having gate lengths of less than 0.5 micrometers are now common.

A gate array is an example of a microelectronic circuit including a large number of devices. A gate array includes a large number of identical cells including devices such as 4-input NAND gates that are formed on a substrate in a rectangular array. Gate arrays including as many as 500,000 cells are possible using current technology.

The cells are initially unconnected, and are interconnected as required by the logical functions of a particular application using a rectangular grid of metallizations that is formed in one or more layers over the cells.

A conventional method of interconnecting logic elements in a gate array is illustrated in FIG. 1. A CMOS gate array 10 comprises a substrate 12 on which are formed a plurality of cells in a rectangular array. One of such cells is illustrated in FIG. 1 and designated as 14. The cell 14 comprises four NMOS transistors NMOS1 to NMOS4 that are formed in the left portion of the cell 14, and four PMOS transistors that are formed in the right portion of the cell 14.

The transistor NMOS1 comprises a diffusion (doped) region 16, and a polysilicon gate 18 that is formed over a gate oxide layer (not shown) and extends horizontally over the diffusion region 16. The transistor NMOS2 comprises a similar polysilicon gate 20 that extends over the diffusion region 16.

The transistor NMOS1 comprises a portion 16a of the diffusion region 16 that constitutes a source or a drain, and a portion 16b that constitutes the other of the source and drain. The transistor NMOS2 comprises the portion 16b of the diffusion region that constitutes a source or a drain, and a portion 16c that constitutes the other of the source and drain. The portion 16b of the diffusion region 16 is common to the transistors NMOS1 and NMOS2.

In an essentially similar manner, the transistors NMOS3 and NMOS4 comprise a common diffusion region 22 and polysilicon gates 24 and 26. The PMOS transistors PMOS1 and PMOS2 comprise a common diffusion region 28 and polysilicon gates 30 and 32, whereas the PMOS transistors PMOS3 and PMOS4 comprise a common diffusion region 34 and polysilicon gates 36 and 38.

The circuit 10 further comprises a negative (or ground) VSS power rail 40 and a positive VDD power rail 42 that extend vertically over the NMOS and PMOS transistors respectively as illustrated.

The transistors of the cell 14 are preferably interconnected to function as a 4-input NAND gate or other suitable device, although such is not the particular subject matter of the present invention.

Due to the high electrical resistance of the diffusion regions and polysilicon gates, all interconnections between points in the circuit 10 must be made through metal traces or "wires" that extend in a grid of routing tracks (not shown) over the transistors of the cell 14.

The wires include a "metal I" layer that can be connected to the transistors, and a "metal II" layer that extends over and can be connected to the metal I layer by vertical interconnects or "vias". The metal I layer is used for vertical and very short horizontal interconnections, whereas the metal II layer is used for horizontal and very short vertical interconnections.

The disadvantages of the conventional technology are illustrated in FIG. 1. Interconnection of any diffusion region inside the rails 40 and 42 to a point outside the rails requires a complicated combination of metal lines, contacts and vias that undesirably occupy routing tracks.

It will be assumed that it is necessary to connect a pin or contact 50 that is ohmically connected to the diffusion region 22 to an external routing line 52. Due to the high resistance of the diffusion region 22, even if heavily doped, it is necessary to make contact to the diffusion region 22 at two points. Since only metal I lines can connect to transistors, two metal I lines 54 and 56 are required to connect to the contact 50 and to another contact 58 respectively. A metal II line 60 is required to interconnect the two metal I lines 54 and 56 using vias 62 and 64 respectively, whereas the metal II line 60 is connected to the routing line 52 by a via 66.

In this manner, providing an external connection for the diffusion region 22 requires two contacts (50 and 58) to the diffusion region 22, two metal I lines 54 and 56, one metal II line 60 and three vias 62, 64 and 66.

Providing an external connection to a contact that is connected to a polysilicon gate inside the rails 40 and 42 is similarly disadvantageous. As illustrated, it is required to connect a contact 70 that is ohmically connected to the gate 38 to an external routing line 72. This requires a short metal I line 74 that extends leftwardly from the contact 70 as viewed in the drawing. The line 74 is connected by a via 76 to a metal II line 78 that extends rightwardly back over the line 74 and is connected to the routing line 72 by a via 80.

Thus, one external connection for the polysilicon gate 38 requires one contact 70, one metal I line 74, one metal II line 78 and two vias 76 and 80.

MOS transistors are four terminal devices, each comprising a source, drain, gate and substrate. The substrate of a MOS transistor must be connected to an appropriate voltage for the transistor to function properly. For this reason, the substrate 12 is provided with a substrate tap 82 between the diffusion regions 16 and 22 of the NMOS transistors NMOS1 to NMOS4. A substrate tap 84 is similarly provided between the diffusion regions 28 and 34 of the PMOS transistors PMOS1 to PMOS4.

The taps 82 and 84 provide direct connection to the material of the substrate 12. The tap 82 for the NMOS transistors is preferably connected to the VSS rail 40 by a contact 86, whereas the tap 84 for the PMOS transistors is connected to the VDD rail 42 by a contact 88. Due to the high resistance of the diffusion regions 16, 22, 28 and 34, the performance of the transistors will be substantially degraded if any attempt is made to reduce the size of the diffusion regions.

SUMMARY OF THE INVENTION

In a microelectronic circuit according to the present invention, field-effect transistors are formed on a substrate having silicided elements including diffusion (source and drain) regions and polysilicon gates. The silicided surfaces of these elements have low ohmic resistance and bifunction to provide interconnection between contacts that are spaced from each other, thereby freeing routing regions for other interconnections.

The diffusion regions of adjacent transistors have edges that face each other, and are formed with indentations which constitute portions of a substrate tap area. The low ohmic resistance of the silicided surfaces of the diffusion regions enables the substrate tap to be cut out of the diffusion regions without degrading the electrical performance of the transistors, thereby providing a substantial reduction in the space required for the transistors on the substrate.

These and other features and advantages of the present invention will be apparent to those skilled in the art from the following detailed description, taken together with the accompanying drawings, in which like reference numerals refer to like parts.

DETAILED DESCRIPTION OF THE INVENTION

As the features of microelectronic circuits continue to shrink, the necessity of decreasing the resistance and capacitance (RC) associated with interconnection paths becomes ever more important. This is particularly true for MOS devices, in which the RC delay due to the interconnect paths can exceed the delays due to gate switching. The higher the value of the interconnect R (resistance) X C (capacitance) product, the more likely the circuit operating speed to be limited by this delay.

Siliciding is fabrication technique that enables electrical interconnections to be made that have reduced resistance and capacitance. The process comprises forming a layer of a refractory metal silicide material such as tungsten, titanium, tantalum, molybdenum, etc. on a diffusion region (source or drain) or on a polysilicon gate to which ohmic contact is to be made, and then reacting the silicide material with the underlaying material to form a silicide surface layer having much lower resistance than heavily doped silicon or polysilicon. A silicide surface layer formed on a polysilicon gate is called "polycide", whereas a silicide surface layer formed on silicon using a self-aligned process is called "salicide".

Figure 1:
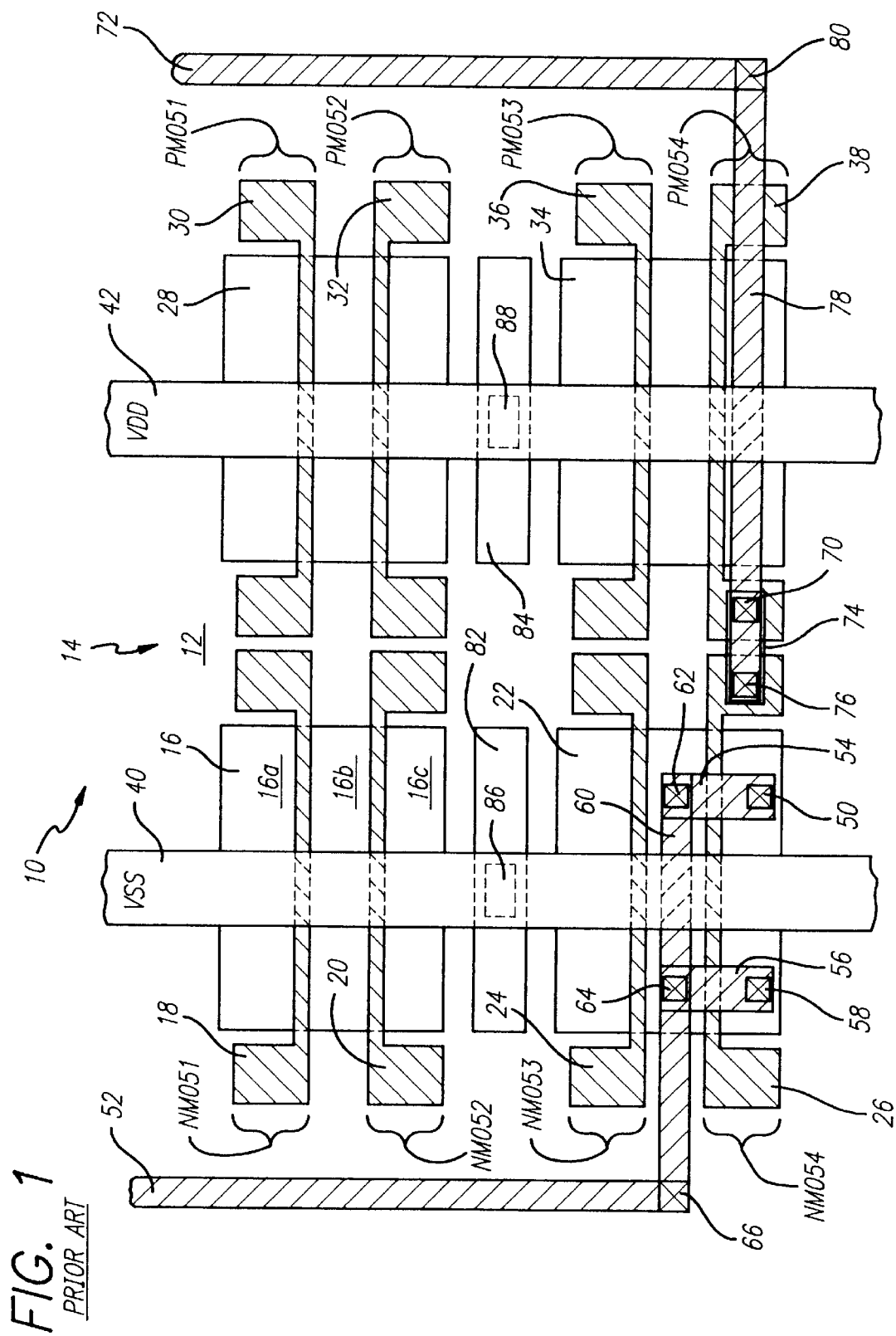
FIG. 1 is a simplified plan view illustrating a conventional cell of a microelectronic gate array circuit.

The present invention exploits the low surface resistance of silicided sources, drains and gates to provide a microelectronic gate array circuit that is substantially more compact and less complicated than the conventional arrangement illustrated in FIG. 1. This is accomplished by configuring the silicided elements to bifunction as interconnects.

Figure 2:
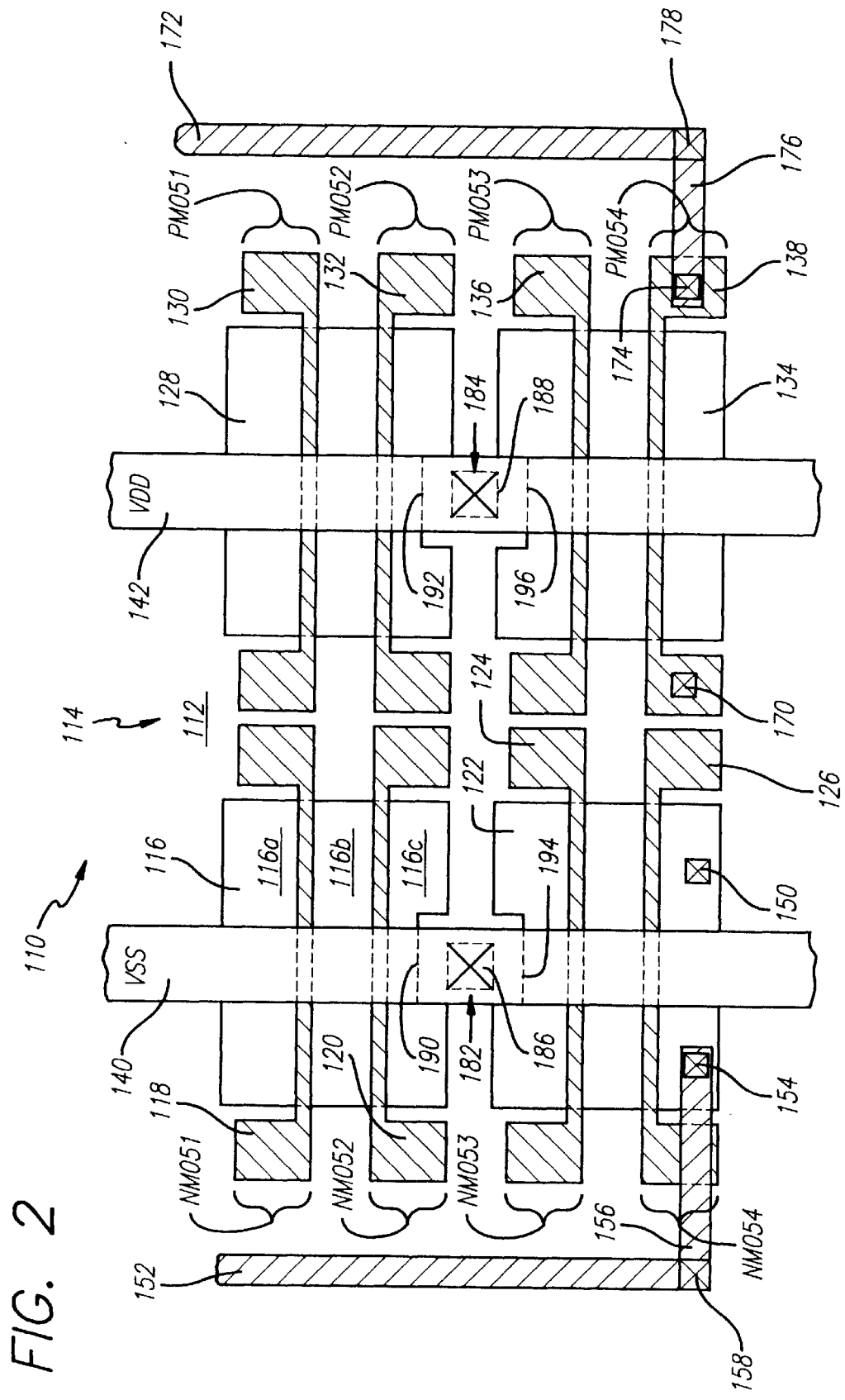
FIG. 2 is similar to FIG. 1, but illustrates a gate array circuit according to the present invention.

As illustrated in FIG. 2, a CMOS gate array 110 according to the present invention comprises a substrate 112 on which are formed a plurality of cells in a rectangular array. One of such cells is illustrated in the drawing and designated as 114. The cell 114 comprises four NMOS transistors NMOS1 to NMOS4 that are formed in the left portion of the cell 114, and four PMOS transistors that are formed in the right portion of the cell 114.

The transistor NMOS1 comprises a diffusion (doped) region 116, and a polysilicon gate 118 that is formed over a gate oxide layer (not shown) and extends horizontally over the diffusion region 116. The transistor NMOS2 comprises a similar polysilicon gate 120 that extends over the diffusion region 116.

The transistor NMOS1 comprises a portion 116a of the diffusion region 116 that constitutes a source or a drain, and a portion 116b that constitutes the other of the source and drain. The transistor NMOS2 comprises the portion 116b of the diffusion region that constitutes a source or a drain, and a portion 116c that constitutes the other of the source and drain. The portion 116b of the diffusion region 116 is common to the transistors NMOS1 and NMOS2.

In an essentially similar manner, the transistors NMOS3 and NMOS4 comprise a common diffusion region 122 and polysilicon gates 124 and 126. The PMOS transistors PMOS1 and PMOS2 comprise a common diffusion region 128 and polysilicon gates 130 and 132, whereas the PMOS transistors PMOS3 and PMOS4 comprise a common diffusion region 134 and polysilicon gates 136 and 138. The circuit 10 further comprises a negative (or ground) VSS power rail 140 and a positive VDD power rail 142 that extend vertically over the NMOS and PMOS transistors respectively as illustrated.

The transistors of the cell 114 are preferably interconnected to function as a 4-input NAND gate or other suitable device, although such is not the particular subject matter of the present invention.

Interconnections between points in the circuit 110 that are constituted by different elements (different diffusions or polysilicon gates) are made through metal traces or "wires" that extend in a grid of routing tracks (not shown) over the transistors of the cell 114.

The wires include a lower or "metal I" layer that can be connected to the transistors, and an upper "metal II" layer that can be connected to the metal I layer by vertical interconnects or "vias". The metal I layer is used for vertical or very short horizontal interconnections, whereas the metal II layer is used for horizontal or very short vertical interconnections.

In contrast to the conventional gate array illustrated in FIG. 1, the diffusion regions and polysilicon gates of the present circuit 110 are silicided as described above such that their surfaces have very low ohmic resistance and capacitance. This enables points that are spaced from each other on a single element to be electrically interconnected by means of the low resistance of the silicide layer on the element. The indirect connections using metal I and metal II layers as described above with reference to FIG. 1 are eliminated in accordance with the present interconnection method.

An example of the present method is illustrated in FIG. 2. It will be assumed that an external connection is to be made between a contact 150 that corresponds to the contact 50 of FIG. 1 and an external routing line 152. The contact 150 is ohmically connected to the diffusion region 122.

This is accomplished in accordance with the invention by ohmically connecting another contact 154 to the diffusion region 122 external of the VSS rail 140, and connecting the contact 154 to the routing line 152 using a via 158. The silicided surface of the diffusion region 122 provides a low ohmic resistance connection between the contacts 154 and 150, located in first and second regions, respectively, of the silicided diffusion region.

The arrangement of FIG. 2 is advantageous over the conventional configuration of FIG. 1 in that two metal I lines and two vias are eliminated, the metal II line has been shortened and the routing tracks that are occupied by the metal I lines 54 and 56 and the metal II line 60 of FIG. 1 have been freed for routing other interconnections.

With further reference being made to FIG. 2, it will be assumed that a contact 170 that is ohmically connected to the polysilicon gate 138 inside the rails 140 and 142 is to be connected to an external routing line 172. The contact 170 corresponds to the contact 70 of FIG. 1.

This interconnection is accomplished using the present method by ohmically connecting a contact 174 to the right end of the gate 138 as viewed in the drawing, and connecting the contact 174 to the routing line 172 using a metal II line 176 and a via 178. The silicided surface of the gate 138 provides a low ohmic resistance connection between the contacts 170 and 174.

The arrangement of FIG. 2 is advantageous over the conventional configuration of FIG. 1 in one metal I line and one via are eliminated, the metal II line has been shortened and the internal routing track that is occupied by the metal II line 78 of FIG. 1 has been freed for routing other interconnections.

In accordance with another feature of the present invention, the low resistance of the silicided diffusion areas 116, 122, 128 and 134 enables these areas to be moved closer together and substantially reduce the area required for each cell 114 in the circuit 110. This enables more cells 114 to fit in the same area of the gate array.

MOS transistors are four terminal devices, each comprising a source, drain, gate and substrate. The substrate of a MOS transistor must be connected to an appropriate voltage for the transistor to function properly. For this reason, the substrate 112 is provided with a substrate tap 182 between the diffusion regions 116 and 122 of the NMOS transistors NMOS1 to NMOS4. A substrate tap 184 is similarly provided between the diffusion regions 128 and 134 of the PMOS transistors PMOS1 to PMOS4.

The taps 182 and 184 provide direct connection to the material of the substrate 112. The tap 182 for the NMOS transistors is preferably connected to the VSS rail 140 by a contact 186, whereas the tap 184 for the PMOS transistors is connected to the VDD rail 142 by a contact 188.

The diffusion regions can be moved closer together by forming their adjacent facing edges with indentations that constitute portions of the substrate taps 182 and 184. More specifically, the lower edge of the diffusion region 116 is formed with a cutout or indentation 190 that faces a conjugate indentation 194 in the upper edge of the diffusion region 122. The diffusion areas 128 and 134 are provided with similar indentations 192 and 196 respectively.

Due to the low resistance of the silicided diffusion regions 116, 122, 128 and 134, the respective indentations 190, 194, 192 and 196 have negligible effect on the performance of the transistors. However, the arrangement of FIG. 2 enables the area required for each cell 114 to be reduced by an estimated 12.5%, enabling a corresponding number of additional cells to be provided in the same area in the gate array.

In summary, the silicided surfaces of the diffusion regions and polysilicon gates of the present microelectronic circuit have low ohmic resistance and bifunction to provide interconnection between contacts that are spaced from each other, thereby freeing routing regions for other interconnections.

The low ohmic resistance of the silicided surfaces of the diffusion regions further enables the substrate tap to be cut out of the diffusion regions without degrading the electrical performance of the transistors, thereby providing a substantial reduction in the space required for the transistors on the substrate.

Various modifications will become possible for those skilled in the art after receiving the teachings of the present disclosure without departing from the scope thereof.

We claim:

1. A microelectronic circuit, comprising:
   a substrate;
   a first field effect transistor that is formed on the substrate and includes a diffusion region constituting a source or drain, said diffusion region having a first surface that is silicided, said first silicided surface comprising a first region and a second region; and
   a first electrical contact within said first region, such that said silicided surface provides an electrical interconnection between said first contact and said second region thereby facilitating collection of electrical current across the first and second regions within the diffusion region to the electrical contact.

2. A circuit as in claim 1:
   further comprising a power rail that extends over the first field effect transistor;
   in which said first and second regions are disposed on laterally opposite sides of the rail respectively.

3. A circuit as in claim 1 further comprising:
   a second field effect transistor having first and second portions constituting a second drain and a second source, said second portion of said second field effect transistor having a second surface that is silicided:
   wherein said first and second silicided surfaces each define a periphery having indentations which face each other respectively, each indentation defining a respective indentation area;
   the circuit further comprises a substrate tap area that is formed at least partially within said indentation areas, said substrate tap area including a substrate tap for providing electrical contact to the substrate; and
   said first and second transistors are interconnected to form integrated circuit logic.

4. A circuit as in claim 3, further comprising a power rail that extends over the first and second field effect transistors and is ohmically connected to said substrate tap area.

5. A microelectronic circuit, comprising:
   a substrate;
   first and second transistors formed on the substrate, said transistors including silicided diffusion regions, each diffusion region constituting a source or a drain, each diffusion region defined by a horizontal periphery having an indentation such that the first transistor diffusion region indentation faces the second transistor diffusion region indentation, each indentation defining a respective indentation area; and
   a substrate tap area that is formed at least partially within said indentation areas, said substrate tap area including a substrate tap for providing electrical contact to the substrate.

6. A circuit as in claim 5, further comprising a power rail that extends over the first and second transistors and is ohmically connected to said substrate tap area.

7. A method of providing an electrical interconnection for gate array field effect transistors formed on a substrate, comprising the steps of:
   (a) forming a first gate array field effect transistor on said substrate as comprising a first gate and a first diffusion region, the first diffusion region constituting a source or drain, said first diffusion region including first and second portions thereof, said first portion of said first diffusion region including a first electrical contact;

(b) siliciding a surface of the first and second portions of the first diffusion region, such that said silicided surface provides a low resistance electrical interconnection between the electrical contact and the second portion of the first diffusion region, thereby facilitating collection of electrical current across the first diffusion region to the electrical contact;

(c) ohmically connecting said first electrical contact to an external routing line.

8. A method as in claim 7, further comprising the step of:

(c) forming a power rail that extends over the first field effect transistor such that said first and second portions of said first diffusion region are disposed on laterally opposite sides of the rail respectively.

9. A method as in claim 7 further comprising the step:

(c) forming a second gate array field effect transistor on said substrate as comprising a second gate and a second diffusion region constituting a source or a drain, the second diffusion region having a surface that is silicided;

the first and second diffusion regions each defined by a horizontal periphery having an indentation, each indentation defining an indentation area, the indentations facing each other respectively;

such that said indentation areas constitute portions of a substrate tap area that is formed at least partially within said indentation areas, said substrate tap area including a substrate tap for providing electrical contact to the substrate; and interconnecting said first and second field effect transistors to form integrated circuit logic.

10. A method as in claim 9, further comprising the step of:

(c) forming a power rail on the substrate that extends over and is ohmically connected to said substrate tap area.

11. A method of fabricating a microelectronic circuit, comprising:

(a) providing a substrate;

(b) forming first and second transistors on the substrate, the first transistor having a first silicided diffusion region constituting a first source or drain, the second transistor having a second silicided diffusion region constituting a second source or drain, each silicided diffusion region defined by a respective horizontal periphery, the peripheries having indentations which face each other respectively on the substrate;

(c) providing a substrate tap at least partially within each indentation, the substrate tap electrically connecting the substrate to a voltage supply; and (d) interconnecting said first and second transistors to form integrated circuit logic.

12. A method as in claim 1, further comprising the step of:

(c) forming a power rail on the substrate that extends over the first and second transistors and is ohmically connected to said substrate tap area.

* * * * *